(12) United States Patent
Ono

(10) Patent No.: US 8,598,699 B2
(45) Date of Patent: Dec. 3, 2013

(54) SEMICONDUCTOR DEVICE HAVING A GROUND METAL LAYER THROUGH WHICH AT LEAST ONE HOLE IS FORMED, AND A GROUND PATCH DISPOSED IN THE AT LEAST ONE HOLE

(75) Inventor: Naoko Ono, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 44 days.

(21) Appl. No.: 13/424,625

(22) Filed: Mar. 20, 2012

(65) Prior Publication Data

US 2012/0175785 A1    Jul. 12, 2012

Related U.S. Application Data

(63) Continuation of application No. PCT/JP2009/004780, filed on Sep. 21, 2009.

(51) Int. Cl.
*H01L 23/12* (2006.01)
*H01L 21/4763* (2006.01)

(52) U.S. Cl.
USPC ........... 257/700; 257/758; 257/774; 257/786; 257/E23.019; 438/622; 438/637

(58) Field of Classification Search
None
See application file for complete search history.

(56) References Cited

U.S. PATENT DOCUMENTS

| | | | |
|---|---|---|---|
| 5,734,313 A | 3/1998 | Doi et al. | |
| 5,789,807 A * | 8/1998 | Correale, Jr. | 257/691 |
| 5,949,098 A * | 9/1999 | Mori | 257/211 |
| 6,717,270 B1 * | 4/2004 | Downey et al. | 257/758 |
| 7,208,837 B2 * | 4/2007 | Wang et al. | 257/758 |
| 7,416,996 B2 * | 8/2008 | Japp et al. | 438/763 |
| 8,211,790 B2 * | 7/2012 | Japp et al. | 438/622 |
| 2006/0103024 A1 * | 5/2006 | Salmon | 257/758 |
| 2008/0009131 A1 * | 1/2008 | Lin et al. | 438/623 |

(Continued)

FOREIGN PATENT DOCUMENTS

| | | |
|---|---|---|
| EP | 0837503 A2 | 4/1998 |
| JP | 3-8360 A | 1/1991 |

(Continued)

OTHER PUBLICATIONS

T. Mitomo et al; A 60-Ghz CMOS Receiver With Frequency Synthesizer; 2007 Symposium on VLSI Circuits Digest of Technical Papers; pp. 172-173.

(Continued)

*Primary Examiner* — Alonzo Chambliss
(74) *Attorney, Agent, or Firm* — Holtz, Holtz, Goodman & Chick, PC

(57) ABSTRACT

In one embodiment, there is provided a semiconductor device that includes: a substrate; a dielectric layer on the substrate; a first ground metal layer embedded in the dielectric layer and having a first DC potential, the first ground metal layer having a first hole therethrough; a first ground patch disposed in the first hole; a second ground metal layer embedded in the dielectric layer such that the dielectric layer is interposed between the first and second ground metal layers in a thickness direction of the dielectric layer, the second ground metal layer having a second DC potential and having a second hole therethrough; a second ground patch disposed in the second hole; a first via which electrically connects the first ground metal layer and the second ground patch; and a second via which electrically connects the second ground metal layer and the first ground patch.

6 Claims, 11 Drawing Sheets

(56) References Cited

U.S. PATENT DOCUMENTS

2008/0054482 A1* 3/2008 Audet et al. .................. 257/774
2008/0191354 A1* 8/2008 Japp et al. .................... 257/759
2008/0246152 A1* 10/2008 Liu et al. ....................... 257/758

FOREIGN PATENT DOCUMENTS

| | | |
|---|---|---|
| JP | 7297188 A | 11/1995 |
| JP | 8-274167 A | 10/1996 |
| JP | 10-189593 A | 7/1998 |
| JP | 11-17003 A | 1/1999 |
| JP | 11-265983 A | 9/1999 |
| JP | 11-285983 A | 9/1999 |
| JP | 2005-322785 A | 11/2005 |
| JP | 2007-134468 A | 5/2007 |

OTHER PUBLICATIONS

International Search Report dated Mar. 9, 2010 (in English) in counterpart International Application No. PCT/JP2009/004780.

* cited by examiner

▨ GROUND METAL LAYER HAVING SECOND DC POTENTIAL
▨ GROUND METAL LAYER HAVING FIRST DC POTENTIAL

▨ GROUND METAL LAYER/GROUND PATCH HAVING SECOND DC POTENTIAL
▦ GROUND METAL LAYER/GROUND PATCH HAVING FIRST DC POTENTIAL

GROUND METAL LAYER/GROUND PATCH HAVING SECOND DC POTENTIAL
GROUND METAL LAYER/GROUND PATCH HAVING FIRST DC POTENTIAL

▨ GROUND METAL LAYER/GROUND PATCH HAVING THIRD DC POTENTIAL
▧ GROUND METAL LAYER/GROUND PATCH HAVING SECOND DC POTENTIAL
▦ GROUND METAL LAYER/GROUND PATCH HAVING FIRST DC POTENTIAL

FIG. 9

| CONTENTS | Z0 [Ω] | β | 100PH INDUCTOR Length [um] | 100PH INDUCTOR Loss [dB] |
|---|---|---|---|---|
| INDUCTOR ELEMENT IN ORDINARY SEMICONDUCTOR DEVICE | 47 | 2660 | 254.9 | 0.14 |
| INDUCTOR ELEMENT IN SEMICONDUCTOR DEVICE 7 | 47 | 2675 | 252.7 | 0.16 |

▨ GROUND METAL LAYER/GROUND PATCH HAVING SECOND DC POTENTIAL
▦ GROUND METAL LAYER/GROUND PATCH HAVING FIRST DC POTENTIAL

SEMICONDUCTOR DEVICE HAVING A GROUND METAL LAYER THROUGH WHICH AT LEAST ONE HOLE IS FORMED, AND A GROUND PATCH DISPOSED IN THE AT LEAST ONE HOLE

This is a Continuation application of PCT Application No. PCT/JP2009/004780, filed on Sep. 21, 2009, which was published under PCT Article 21(2) in Japanese, the entire contents of which are incorporated herein by reference.

BACKGROUND

1. Field

Embodiments described herein relate to a semiconductor device.

2. Description of the Related Art

Generally, a transmission line used for a semiconductor device includes a signal metal layer and a ground metal. In most cases, usually, the ground metal has one DC potential such as 0V.

It may be necessary to give another DC than 0V to an element such as a transistor in accordance with the circuit configuration of the semiconductor device. In this case, there is a problem that electromagnetic field of the transmission line is disordered to make the transmission line discontinuous in terms of high frequency because the structure of the transmission line must be made partially imperfect to give another DC than 0V to the element.

BRIEF DESCRIPTION OF THE DRAWINGS

A general architecture that implements the various features of the invention will now be described with reference to the drawings. The drawings and the associated descriptions are provided to illustrate embodiments of the invention and not to limit the scope of the invention:

FIG. 9 is a view showing characteristic of the semiconductor device 6 according to the third exemplary embodiment;

DETAILED DESCRIPTION

Figure 1A:
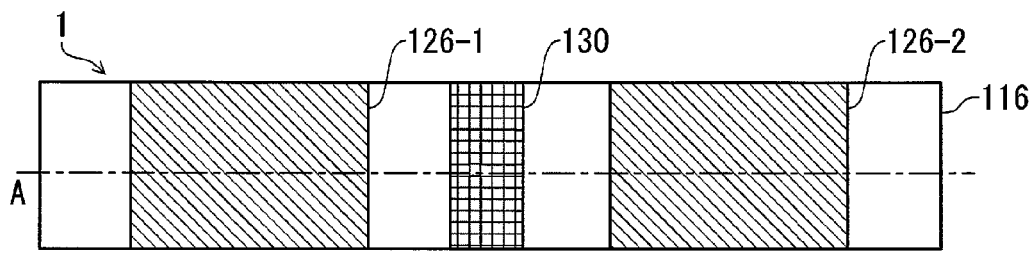
FIGS. 1A and 1B are views showing a semiconductor device 1 according to a first exemplary embodiment.

According to exemplary embodiments of the present invention, there is provided a semiconductor device. The semiconductor device includes: a substrate; first to n-th dielectric layers which are formed successively on one surface of the substrate, wherein n is a natural number of 2 or more; a k-th ground metal layer having a first DC potential and disposed between the k-th dielectric layer and the (k+1)-th dielectric layer, the k-th ground metal layer having at least one first hole therethrough, wherein k is a natural number of $1 \leq k < n$; a k-th ground patch disposed in the at least one first hole; a (k+m)-th ground metal layer having a second DC potential and disposed between the (k+m)-th dielectric layer and the (k+m+1)-th dielectric layer, the (k+m)-th ground metal layer having at least one second hole therethrough, wherein m is a natural number of $1 \leq m < n-k$; a (k+m)-th ground patch disposed in the at least one second hole; a first via which connects the k-th ground metal layer and the (k+m)-th ground patch; and a second via which connects the (k+m)-th ground metal layer and the k-th ground patch.

Exemplary embodiments of the invention will be described below with reference to the drawings. Incidentally, parts referred to by the same numerals perform the same operations in the following exemplary embodiments so that duplicated description will be omitted. Although a semiconductor device according to each exemplary embodiment of the invention has a transmission line and circuit elements, etc. than the transmission line, the circuit elements, etc. will be omitted and only the transmission line will be described in the following description. Incidentally, the transmission line includes a high frequency signal metal layer (hereinafter referred to as signal metal layer) and a high frequency ground metal (hereinafter referred to as ground metal).

First Exemplary Embodiment

FIG. 1 shows a semiconductor device 1 according to a first exemplary embodiment of the invention. The semiconductor device 1 has a substrate 100, first to n-th dielectric layers 111 to 11*n* (in which n is an integer not smaller than 2 and n=6 in FIG. 1) laminated on one surface of the substrate 100, k-th ground metal layers 12*k* provided between k-th dielectric layers 11*k* (in which k is an integer satisfying $1 \leq k < n$ and k=1, 3, 5 in FIG. 1) and (k+1)-th dielectric layers 11(*k*+1), and (k+m)-th ground metal layers 12(*k*+*m*) provided between (k+m)-th dielectric layers 11(*k*+*m*) (in which m is an integer satisfying $1 \leq m < n-k$ and m=1 in FIG. 1) and (k+m+1)-th dielectric layers 11(*k*+*m*+1). The k-th ground metal layers 12*k* have a first DC potential. The (k+m)-th ground metal layers 12(*k*+*m*) have a first DC potential. The semiconductor device 1 further has a signal metal layer 130. In the example in FIG. 1, the signal metal layer 130 is provided between the k-th-1 ground metal layer 12*k*-1 and the k-th-2 ground metal layer 12*k*-2. The transmission line of the semiconductor device 1 includes the signal metal layer 130 as a high frequency signal metal layer and the ground metal (k-th ground metal layers 12*k* and (k+m)-th ground metal layers 12(*k*+*m*)) as a high frequency ground metal.

Figure 1B:
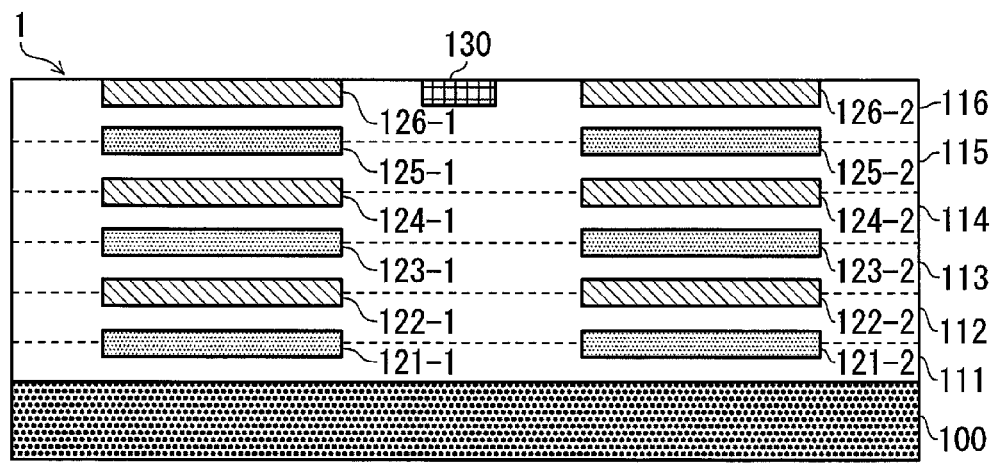

Details of the semiconductor device 1 will be described with reference to FIG. 1. FIG. 1A is a top view of the transmission line provided in the semiconductor device 1. FIG. 1B is a sectional view taken along an alternate long and short dash line A in the top view and showing the transmission line provided in the semiconductor device 1. Incidentally, FIG. 1A is a view showing an extracted part of the transmission line, and the actual length of the transmission line varies according to the size of the semiconductor device 1, the arrangement of circuit elements (not shown) provided in the semiconductor device 1, etc.

The substrate 100 is a silicon substrate. The first to n-th dielectric layers 111 to 11n are thin layers of a dielectric made of SiO or the like and are also referred to as thin-film dielectric layers. As shown in FIG. 1B, n=6 in this exemplary embodiment. The first to sixth dielectric layers 111 to 116 are laminated on one surface of the substrate 100 so that the first, second, . . . , and sixth dielectric layers are arranged in this order in view of the substrate side. Although it appears from FIG. 1B that the first to n-th dielectric layers 111 to 11n are thicker than the substrate 100 because only one part of the substrate 100 is described in FIG. 1B, the substrate 100 is actually thicker than the first to n-th dielectric layers 111 to 11n.

The k-th-1 ground metal layers 12k-1 and the k-th-2 ground metal layers 12k-2 are provided between the k-th dielectric layers 11k and the (k+1)-th dielectric layers 11(k+1), respectively. The k-th-1 ground metal layers 12k-1 are provided so as to be parallel with the k-th-2 ground metal layers 12k-2. Specifically, the first-1 ground metal layer 121-1 and the first-2 ground metal layer 121-2 are provided between the first dielectric layer 111 and the second dielectric layer 112, and the second-1 ground metal layer 122-1 and the second-2 ground metal layer 122-2 are provided between the second dielectric layer 112 and the third dielectric layer 113. The third-1 and third-2 ground metal layers 123-1 and 123-2 are provided between the third and fourth dielectric layers 113 and 114, the fourth-1 and fourth-2 ground metal layers 124-1 and 124-2 are provided between the fourth and fifth dielectric layers 114 and 115, and the fifth-1 and fifth-2 ground metal layers 125-1 and 125-2 are provided between the fifth and sixth dielectric layers 115 and 116. In the example in FIG. 1, sixth-1 and sixth-2 ground metal layers 126-1 and 126-2 are further laminated on the sixth dielectric layer 116. Each of the first-1 to sixth-1 ground metal layers 121-1 to 126-1 and the first-2 to sixth-2 ground metal layers 121-2 to 126-2 is made of metal such as Cu, Al or Au.

The k-th-1 ground metal layers 12k-1 and the k-th-2 ground metal layers 12k-2 are hereinafter generically called k-th ground metal layers 12k.

In FIG. 1B, the first, third and fifth ground metal layers 121, 123 and 125 have a first DC potential. The second, fourth and sixth ground metal layers 122, 124 and 126 have a first DC potential. For example, the first DC potential is ground (0V) whereas the first DC potential is a power supply voltage (Vdd).

The signal metal layer 130 is provided in the one surface of the sixth dielectric layer 116 and between the sixth-1 and sixth-2 ground metal layers 126-1 and 126-2. The signal metal layer 130 is disposed in parallel with the sixth-1 and sixth-2 ground metal layers 126-1 and 126-2. The signal metal layer 130 is made of metal such as Cu, Al or Au. The first to sixth ground metal layers 121 to 126 and the signal metal layer 130 form a transmission line.

As described above, because the first exemplary embodiment is configured so that one part of laminated ground metal layers have a first DC potential and the other part of the laminated ground metal layers have a first DC potential, a transmission line having a plurality of DC potentials can be achieved with a small area. Accordingly, the semiconductor device 1 can be miniaturized. Moreover, the transmission line has a plurality of DC potentials. Therefore, it is unnecessary to make the transmission line partially imperfect to supply DC potentials when a plurality of DC potentials are supplied to circuit elements. Thus, the transmission line can be kept continuous without disturbance in electromagnetic field of the transmission line.

(Modification 1)

Figure 2:
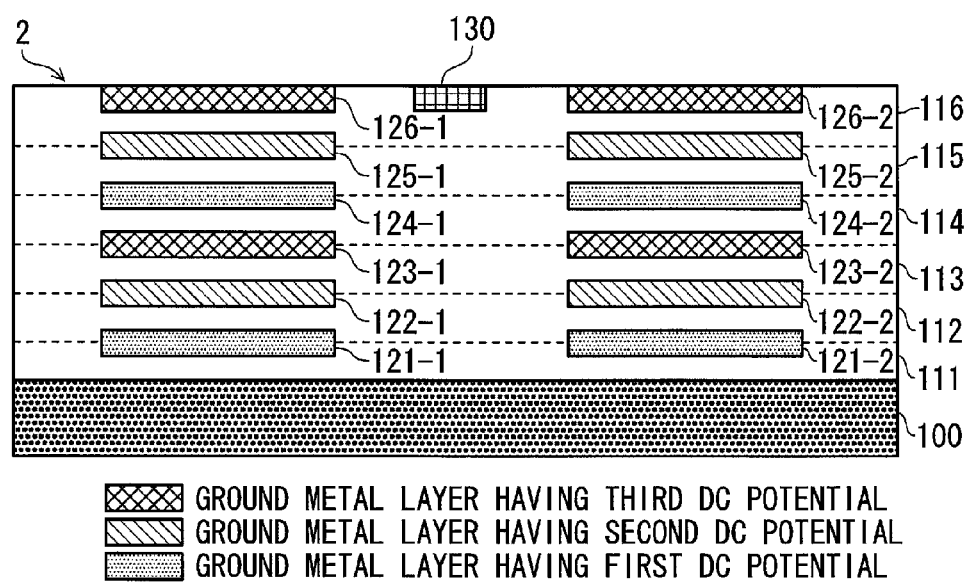
FIG. 2 is a view showing a semiconductor device 2 according to Modification 1 of the first exemplary embodiment.

FIG. 2 shows a semiconductor device 2 according to Modification 1 of this exemplary embodiment. In the first exemplary embodiment, each of the first to sixth ground metal layers 121 to 126 has either a first DC potential or a first DC potential. In this modification, each of the first to sixth ground metal layers 121 to 126 has any one of first to first DC potentials. FIG. 2 shows a sectional view of the semiconductor device 2 according to this modification.

The first and fourth ground metal layers 121 and 124 have a first DC potential. The second and fifth ground metal layers 122 and 125 have a first DC potential. The third and sixth ground metal layers 123 and 126 have a first DC potential. In the first exemplary embodiment, ground metal layers having a first DC potential and ground metal layers having a first DC potential are laminated alternately. When ground metal layers are laminated so that ground metal layers having a first DC potential, ground metal layers having a first DC potential, ground metal layers having a first DC potential, . . . are arranged in order, a transmission line having three or more kinds of DC potentials can be achieved.

Second Exemplary Embodiment

FIG. 3 shows a semiconductor device 3 according to a second exemplary embodiment of the invention. This exemplary embodiment is different from the first exemplary embodiment in that ground metal layers having a first DC potential are connected to one another by first vias, and ground metal layers having a first DC potential are connected to one another by second vias.

The semiconductor device 3 according to this exemplary embodiment has k-th ground metal layers 14k each with at least one hole (first hole) 150 in place of the k-th ground metal layers 11k of the semiconductor device 1 in FIG. 1, and (k+m)-th ground metal layers 14(k+m) each with at least one hole (second hole) 160 in place of the (k+m)-th ground metal layers.

The semiconductor device 3 further has k-th ground patches 17k provided between the k-th dielectric layers 11k and the (k+1)-th dielectric layers 11(k+1) and inside the first holes 150, and (k+m)-th ground patches 17(k+m) provided between the (k+m)-th dielectric layers 11(k+m) and the (k+m+1)-th dielectric layers 11(k+m+1) and inside the second holes 160. The k-th ground metal layers 14k and the (k+m)-th ground patches 17(k+m) are connected by first vias 180. The (k+m)-th ground metal layers 14(k+m) and the k-th ground patches 17(k+m) are connected by second vias 190. Small ground metal pieces provided inside the first holes or second holes in this manner are called ground metal layers.

Figure 3A:
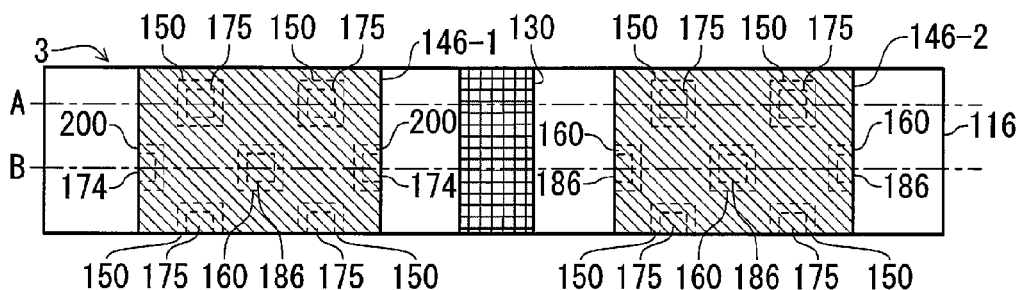
FIGS. 3A to 3C are views showing a semiconductor device 3 according to a second exemplary embodiment.
Figure 3B:
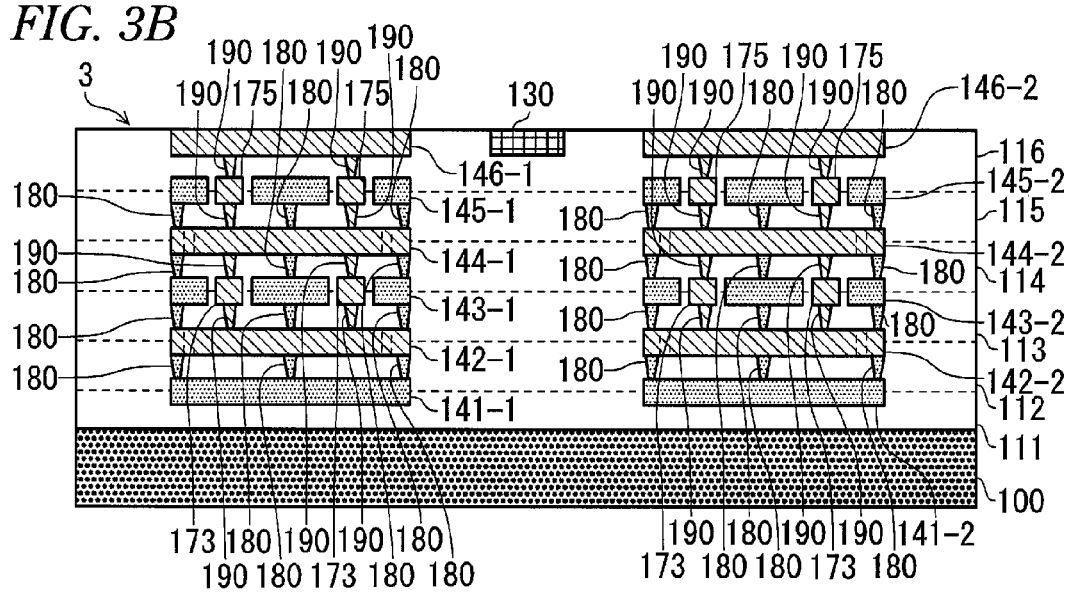
Figure 3C:
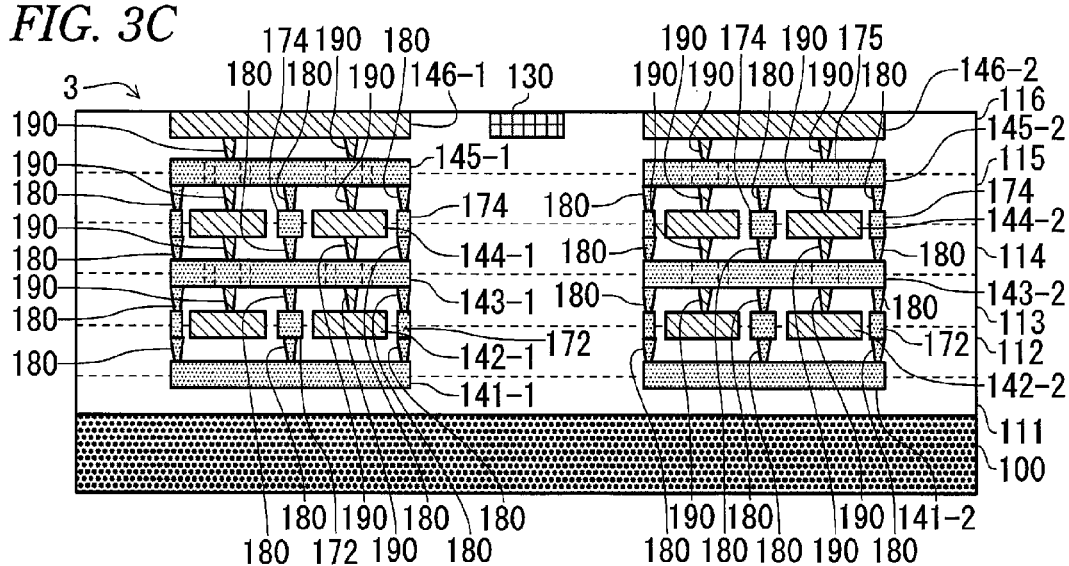

FIG. 3A is a top view of the semiconductor device 3, FIG. 3B is a sectional view of the semiconductor device 3 taken along an alternate long and short dash line B in the top view, and FIG. 3C is a sectional view of the semiconductor device 3 taken along an alternate long and short dash line C in the top view.

T-th-1 ground metal layers 14t-1 and t-th-2 ground metal layers 14t-2 are provided between the t-th dielectric layers 11t and the (t+1)-th dielectric layers 11(t+1), respectively. The t-th-1 ground metal layers 14t-1 are provided in parallel with the t-th-2 ground metal layers 14t-2. The t-th-1 ground metal layers 14t-1 and the t-th-2 ground metal layers 14t-2 are hereinafter generically called t-th ground metal layers 14t. Incidentally, t is an integer not smaller than 1 and not larger than n.

In the example shown in FIG. 3, n=6. Accordingly, the semiconductor device 3 has first to sixth ground metal layers 141 to 146.

The first ground metal layers 141 have a first DC potential like the first ground metal layers 121 in FIG. 1.

Figure 4A:
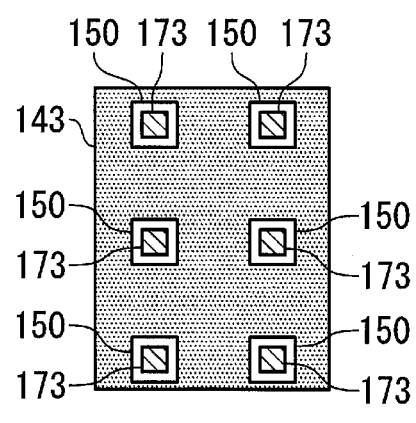
FIGS. 4A and 4B are views showing a second ground metal layer 142 and a third ground metal layer 143 according to the second exemplary embodiment.

Each of the third and fifth ground metal layers 143 and 145 has a plurality of first holes 150. FIG. 4A shows an example of the third ground metal layer 143. In the example in FIG. 4A, the first holes 150 each shaped like a quadrangle are formed periodically in the third ground metal layer 143. That is, the third ground metal layer 143 is a lattice (mesh) ground metal layer. Incidentally, the fifth ground metal layer 145 also has the same shape.

As shown in FIGS. 3A and 3B, the first holes 150 provided in each of the third and fifth ground metal layers 143 and 145 are disposed so as to overlap one another in a direction perpendicular to the top surface of the semiconductor device 3, that is, one surface of the substrate 130 where the dielectric layers 111 to 116 are laminated. That is, the first holes 150 formed in the third ground metal layer 143 are disposed in the same places as the first holes 150 formed in the fifth ground metal layer 145 in the direction perpendicular to the one surface of the substrate 130. The third and fifth ground metal layers 143 and 145 have a first DC potential.

Figure 4B:
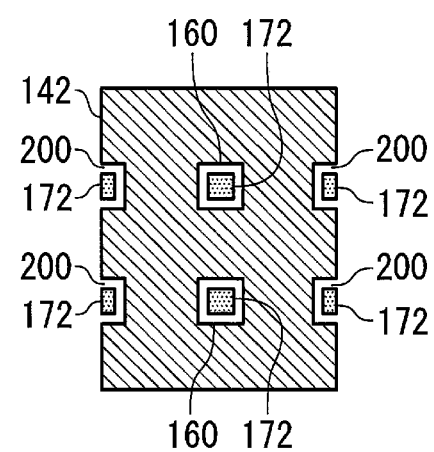

Each of the second and fourth ground metal layers 142 and 144 has a plurality of second holes 160 and notches 200. FIG. 4B shows an example of the second ground metal layer 142. In the example in FIG. 4B, the second holes 160 each shaped like a quadrangle are formed periodically in the second ground metal layer 142. The notches 200 are provided in two opposite sides of the second ground metal layer 142. That is, the second ground metal layer 142 is a lattice (mesh) ground metal layer. Incidentally, each fourth ground metal layer 144 also has the same shape.

As shown in FIGS. 3A and 3B, the second holes 160 and the notches 200 provided in each of the second and fourth ground metal layers 142 and 144 are disposed so as to overlap one another in the direction perpendicular to the top surface of the semiconductor device 3, that is, the one surface of the substrate 130 where the dielectric layers 111 to 116 are laminated. The second holes 160 and the notches 200 formed in the second ground metal layer 142 are disposed in the same places as the second holes 160 and the notches 200 formed in the fourth ground metal layer 144 in the direction perpendicular to the one surface of the substrate 130. Incidentally, in the example in FIG. 3, the second holes 160 and the notches 200 are disposed so as not to overlap the first holes 150 in the direction perpendicular to the one surface of the substrate 130 where the dielectric layers 111 to 116 are laminated. The second and fourth ground metal layers 142 and 144 have a first DC potential.

The sixth ground metal layers 146 have a first DC potential like the sixth ground metal layers 126 in FIG. 1.

In this exemplary embodiment, the k-th ground metal layers 14k represent the second and fourth ground metal layers 142 and 144, and the (k+m)-th ground metal layers 14(k+m) represent the third and fifth ground metal layers 143 and 145.

Refer back to FIG. 4A. The third ground patches 173 are provided inside the first holes 150 of the third ground metal layer 143. The fifth ground patches 175 are provided inside the first holes 150 of the fifth ground metal layer 145. The third and fifth ground patches 173 and 175 are made of metal such as Cu, Al or Au. In the example shown in FIG. 4A, each third ground patch 173 is shaped like a quadrangle. When a plurality of first holes 150 are formed, the third and fifth ground patches 173 and 175 are provided inside the plurality of first holes 150, respectively.

As shown in FIG. 3B, the third and fifth ground patches 173 and 175 are disposed so as to overlap the second, fourth and sixth ground metal layers 142, 144 and 146 in the direction perpendicular to the top surface of the semiconductor device 3, that is, the one surface of the substrate 130 where the dielectric layers 111 to 116 are laminated. The third and fifth ground patches 173 and 175 have a first DC potential.

The second and fourth ground patches 172 and 174 will be described with reference to FIG. 4B. The second ground patches 172 are provided inside the second holes 160 and the notches 200 in the second ground metal layer 142. The fourth ground patches 174 are provided inside the second holes 160 and the notches 200 in the fourth ground metal layer 144. The second and fourth ground patches 172 and 174 are made of metal such as Cu, Al or Au. In the example in FIG. 4B, each second ground patch 172 is shaped like a quadrangle. When a plurality of second holes 160 and a plurality of notches 200 are formed, the second and fourth ground patches 172 and 174 are provided inside the plurality of second holes 160 and the plurality of notches 200, respectively.

As shown in FIG. 3C, the second and fourth ground patches 172 and 174 are disposed so as to overlap the second, fourth and sixth ground metal layers 142, 144 and 146 in the direction perpendicular to the top surface of the semiconductor device 3, that is, the one surface of the substrate 130 where the dielectric layers 111 to 116 are laminated. The second and fourth ground patches 172 and 174 have a first DC potential.

In this exemplary embodiment, the k-th ground patches 17k represent the second and fourth ground patches 172 and 174, and the (k+m)-th ground patches 17(k+m) represent the third and fifth ground patches 173 and 175.

The first vias 180 connect the k-th ground metal layers 14k and the (k+m)-th ground patches 17(k+m). As shown in FIGS. 3B and 3C, the first vias 180 are provided inside the second dielectric layer 112 and connect the first ground metal layers 141 and the second ground patches 172. The first vias 180 are provided inside the third dielectric layer 123 and connect the second ground patches 172 and the third ground metal layers 143. The first vias 180 are provided inside the fourth dielectric layer 124 and connect the third ground metal layers 143 and the fourth ground patches 174. The first vias 180 are provided inside the fifth dielectric layer 125 and connect the fourth ground patches 174 and the fifth ground metal layers 145.

The second vias 190 connect the (k+m)-th ground metal layers 14(k+m) and the k-th ground patches 17k. As shown in FIGS. 3B and 3C, the second vias 190 are provided inside the third dielectric layer 113 and connect the second ground metal layers 142 and the third ground patches 173. The second vias 190 are provided inside the fourth dielectric layer 124 and connect the third ground patches 173 and the fourth ground metal layers 144. The second vias 190 are provided inside the fifth dielectric layer 125 and connect the fourth ground metal layers 144 and the fifth ground patches 175. The second vias 190 are provided inside the sixth dielectric layer 126 and connect the fifth ground patches 175 and the sixth ground metal layers 146.

As described above, in the semiconductor device 3 according to this exemplary embodiment, the same effect as in the first exemplary embodiment can be obtained and ground metal layers having the same DC potential can be connected through ground patches by vias to keep the DC potential of the ground metal layers equal. That is, when a first DC potential is applied to any one of the first, third and fifth ground metal layers 141, 143 and 145, all the first, third and fifth ground metal layers 141, 143 and 145 can have the first DC potential.

(Modification 2)

Figure 5A:
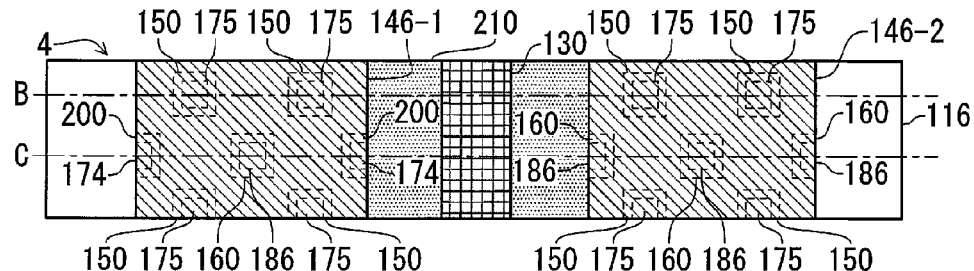
FIGS. 5A to 5C are views showing a semiconductor device 4 according to Modification 2 of the second exemplary embodiment.
Figure 5B:
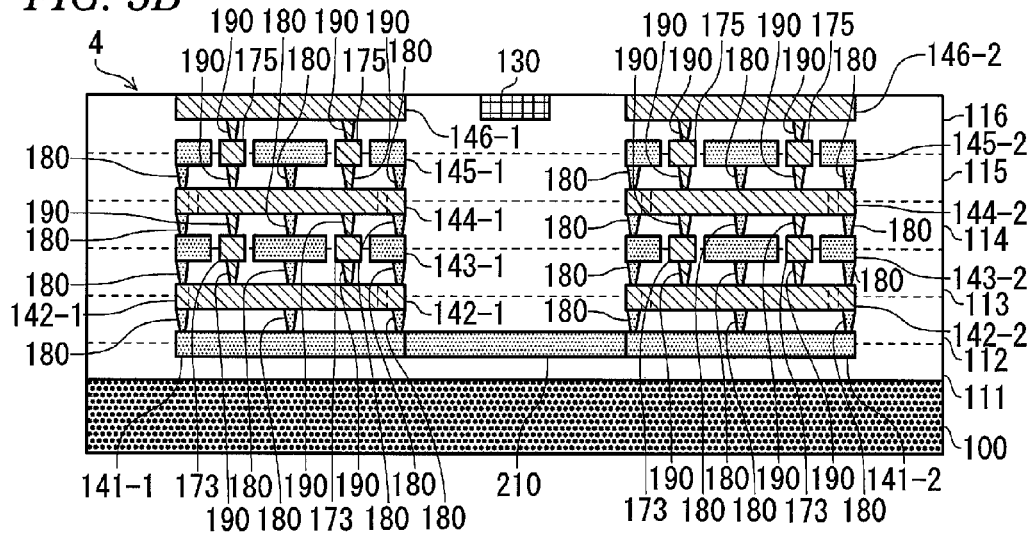
Figure 5C:
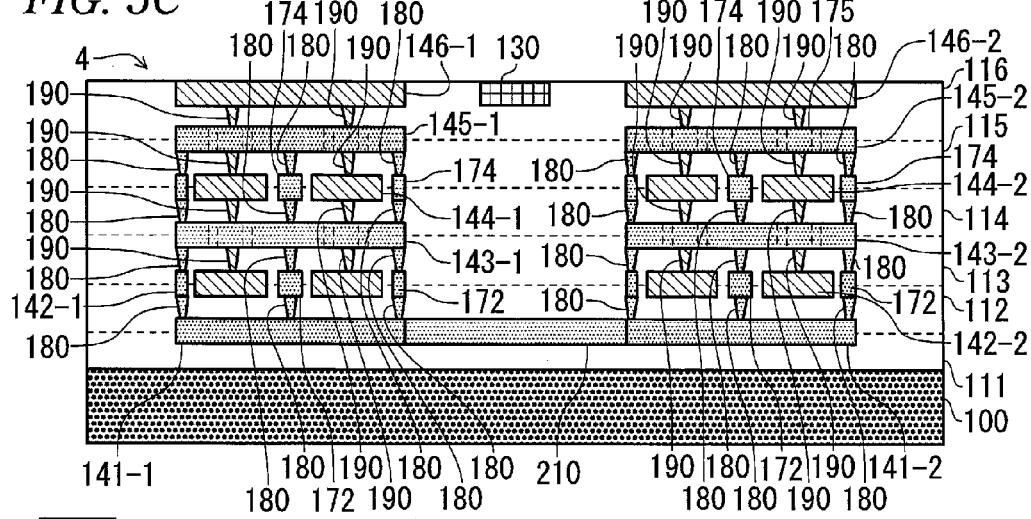

FIG. 5 shows a semiconductor device 4 according to Modification 2 of this exemplary embodiment. FIG. 5A is a top view of the semiconductor device 4, FIG. 5B is a sectional view of the semiconductor device 4 taken along an alternate long and short dash line B in the top view, and FIG. 5C is a sectional view of the semiconductor device 4 taken along an alternate long and short dash line C in the top view. The semiconductor device 4 has the same configuration as that of the semiconductor device 3 in FIG. 3 except that a ground metal layer 210 is provided between the first dielectric layer 111 and the second dielectric layer 112.

The ground metal layer 210 has one side connected to one side of the first-1 ground metal layer 141-1, and the other side connected to one side of the first-2 ground metal layer 141-2. The ground metal layer 210 is provided between the signal metal layer 130 and the substrate 100. The provision of the ground metal layer 210 can reduce the influence of the substrate on the signal metal layer 130. For example, even when noise is propagated from the substrate, the noise can be prevented from being transmitted to the signal metal layer 130. The ground metal layer 210 may be formed so as to be integrated with the first ground metal layers 141.

(Modification 3)

Figure 6A:
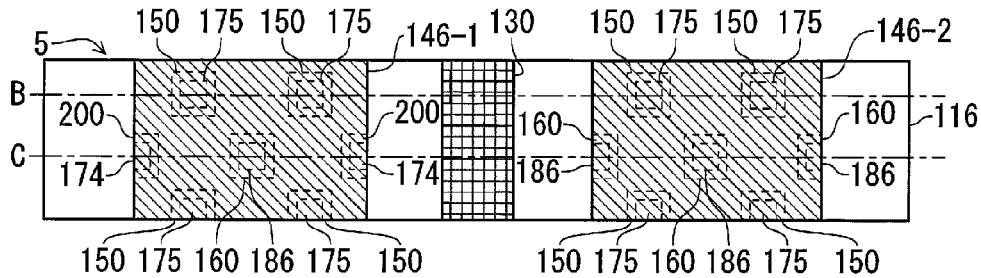
FIGS. 6A to 6C are views showing a semiconductor device 5 according to Modification 3 of the second exemplary embodiment.
Figure 6B:
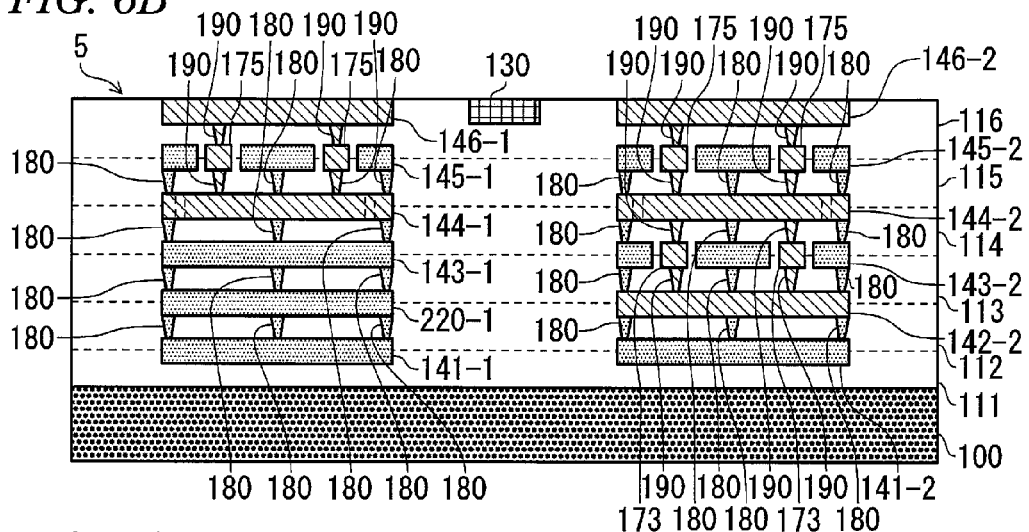
Figure 6C:
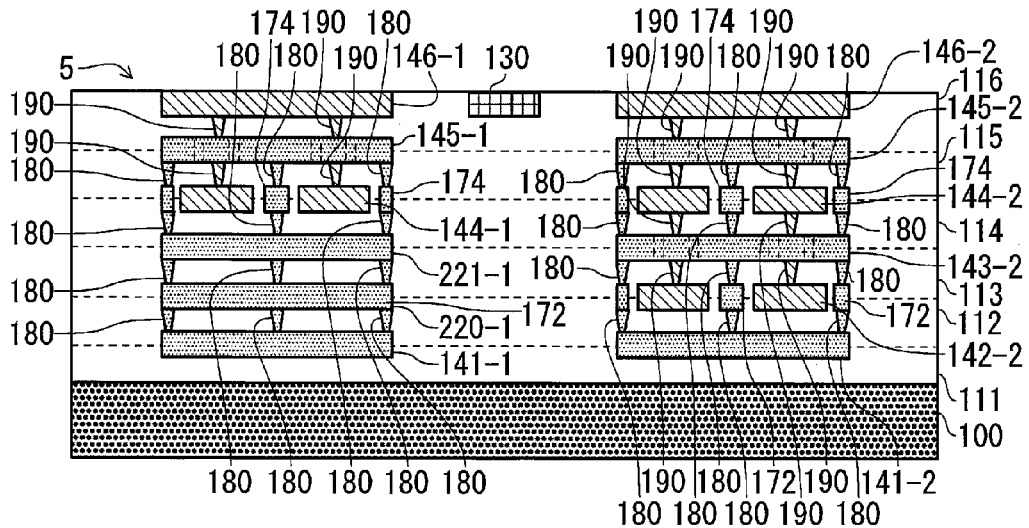

FIG. 6 shows a semiconductor device 5 according to Modification 3 of this exemplary embodiment. The semiconductor device 5 has a second-1 ground metal layer 220-1 in place of the second-1 ground metal layer 142-1, and a third-1 ground metal layer 221-1 in place of the third-1 ground metal layer 143-1.

There is no hole formed in the second-1 ground metal layer 220-1 and the third-1 ground metal layer 221-1. The second-1 ground metal layer 220-1 and the third-1 ground metal layer 221-1 have a first DC potential. In FIG. 6, the second-1 ground metal layer 220-1 is connected to the first-1 ground metal layer 141-1 through vias and the third-1 ground metal layer 221-1 is connected to the second-1 ground metal layer 220-1 through vias. However, the second-1 ground metal layer 220-1 and the third-1 ground metal layer 221-1 need not be connected thus.

In FIG. 4, the first to sixth ground metal layers 141 to 146 have alternately different DC potentials. However, the first to sixth ground metal layers 141 to 146 need not have alternately different DC potentials. As shown in FIG. 6, ground metal layers having the same DC potential may be laminated continuously. In this case, it is unnecessary to form any hole in ground metal layers sandwiched between ground metal layers having the same DC potential.

Third Exemplary Embodiment

FIG. 7 shows a semiconductor device 6 according to a third exemplary embodiment of the invention. This exemplary embodiment is different from the second exemplary embodiment in that ground metal layers have a first DC potential in addition to the first and second DC potentials.

The semiconductor device 6 according to this exemplary embodiment is different from the semiconductor device 3 shown in FIG. 3 in that the semiconductor device 6 has: k-th ground metal layers 30$k$ having first holes 310 and second holes 320 and having a first DC potential; (k+m)-th ground metal layers 30($k+m$) having third holes 330 and fourth holes 350 and having a first DC potential; and (k+s)-th ground metal layers 30($k+s$) (in which s is an integer satisfying 1≤s<n−k) having fifth holes 350 and sixth holes 360 and having a first DC potential.

The semiconductor device 6 further has: k-th ground patches 410 provided between the k-th dielectric layers 11$k$ and the (k+1)-th dielectric layers 11($k+1$) and inside the first holes 310; and k'-th ground patches 420 provided between the k-th dielectric layers 11$k$ and the (k+1)-th dielectric layers 11($k+1$) and inside the second holes 320.

The semiconductor device 6 further has: (k+m)-th ground patches 430 provided between the (k+m)-th dielectric layers 11($k+m$) and the (k+m+1)-th dielectric layers 11($k+m+1$) and inside the third holes 330; and (k+m)'-th ground patches 440 provided between the (k+m)-th dielectric layers 11($k+m$) and the (k+m+1)-th dielectric layers 11($k+m+1$) and inside the fourth holes 340.

The semiconductor device 6 further has: (k+s)-th ground patches 450 provided between the (k+s)-th dielectric layers 11($k+s$) and the (k+s+1)-th dielectric layers 11($k+s+1$) and inside the fifth holes 350; and (k+s)'-th ground patches 460 provided between the (k+s)-th dielectric layers 11($k+s$) and the (k+s+1)-th dielectric layers 11($k+s+1$) and inside the sixth holes 360.

The k-th ground metal layers 30$k$, the (k+m)-th ground patches 430 and the (k+s)'-th ground patches 460 are connected by first vias.

The k'-th ground patches 420, the (k+m)-th ground metal layers 30($k+m$) and the (k+s)-th ground patches 450 are connected by second vias.

The k-th ground patches 410, the (k+m)'-th ground patches 440 and the (k+s)-th ground metal layers 30($k+s$) are connected by third vias.

Figure 7A:
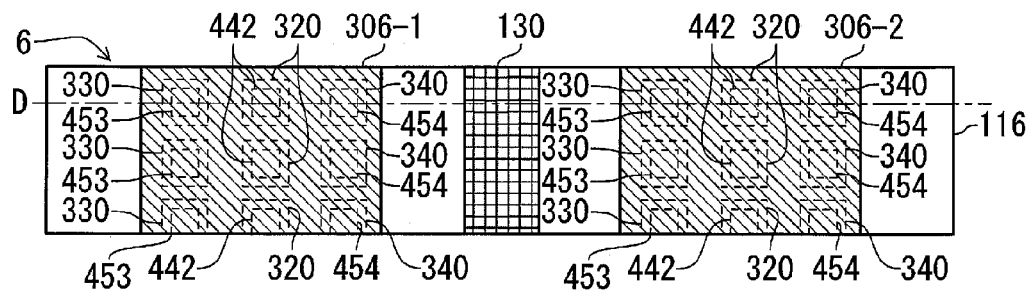
FIGS. 7A and 7B are views showing a semiconductor device 6 according to a third exemplary embodiment.
Figure 7B:
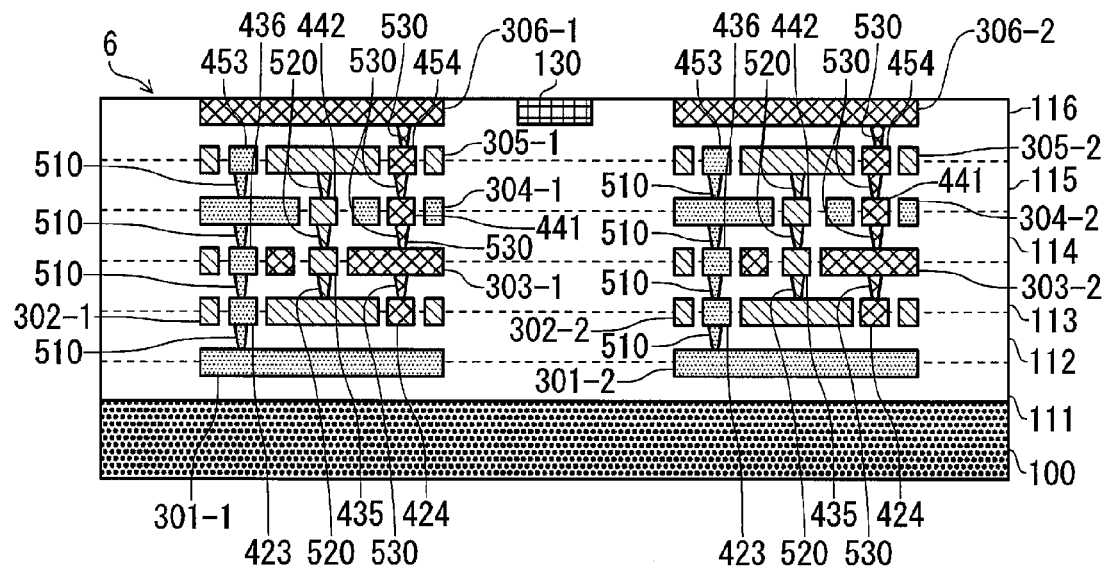

FIG. 7A is a top view of the semiconductor device 6, and FIG. 7B is a sectional view of the semiconductor device 6 taken along an alternate long and short dash line D in the top view.

T-th-1 ground metal layers 30$t$-1 and t-th-2 ground metal layers 30$t$-2 are provided between the t-th dielectric layers 11$t$ and the (t+1)-th dielectric layers 11($t+1$), respectively. The t-th-1 ground metal layers 30$t$-1 are provided in parallel with the t-th-2 ground metal layers 30$t$-2. The t-th-1 ground metal layers 30$t$-1 and the t-th-2 ground metal layers 30$t$-2 are hereinafter generically called t-th ground metal layers 30$t$.

In the example in FIG. 7, n=6. Accordingly, the semiconductor device 6 has first to sixth ground metal layers 301 to 306.

The first ground metal layers 301 have a first DC potential like the first ground metal layers 121 in FIG. 1. The second ground metal layers 301 have a plurality of third holes 330 and a plurality of fourth holes 340 and have a first DC potential. The third ground metal layers 303 have a plurality of fourth holes 340 and a plurality of fifth holes 350 and have a first DC potential. The fourth ground metal layers 304 have a plurality of first holes 310 and a plurality of second holes 320 and have a first DC potential. The fifth ground metal layers 305 have a plurality of third holes 330 and a plurality of fourth holes 340 and have a first DC potential. The sixth ground metal layers 306 have the same shape as that of the sixth ground metal layers 126 in FIG. 1 and have a first DC potential. In this exemplary embodiment, the k-th ground metal layers 30$k$ represent the fourth ground metal layers 304, the (k+m)-th ground metal layers 30($k+m$) represent the second and fifth ground metal layers 302 and 305, and the (k+s)-th ground metal layers 30($k+s$) represent the third ground metal layers 303.

The first to sixth holes each shaped like a quadrangle are formed periodically in the ground metal layers respectively.

As shown in FIG. 7B, the third holes 330 provided in the second and fifth ground metal layers 302 and 305 and the sixth holes 360 provided in the third ground metal layers 303 are disposed so as to overlap one another in a direction perpendicular to the top surface of the semiconductor device 6, that is, one surface of the substrate 130 where the dielectric layers 111 to 116 are laminated.

The second holes 320 provided in the fourth ground metal layers 304 and the fifth holes 350 provided in the third ground metal layers 303 are disposed so as to overlap one another in the direction perpendicular to the one surface of the substrate 130 where the dielectric layers 111 to 116 are laminated.

The first holes provided in the fourth ground metal layers 304 and the fourth holes 340 provided in the second and fifth ground metal layers 302 and 305 are disposed so as to overlap one another in the direction perpendicular to the top surface of the semiconductor device 6, that is, the one surface of the substrate 130 where the dielectric layers 111 to 116 are laminated.

The respective ground patches will be described with reference to FIG. 8. Each ground patch is shaped like a quadrangle. Each ground patch is made of metal such as Cu, Al or Au.

Figures 8A, 8B, 8C:
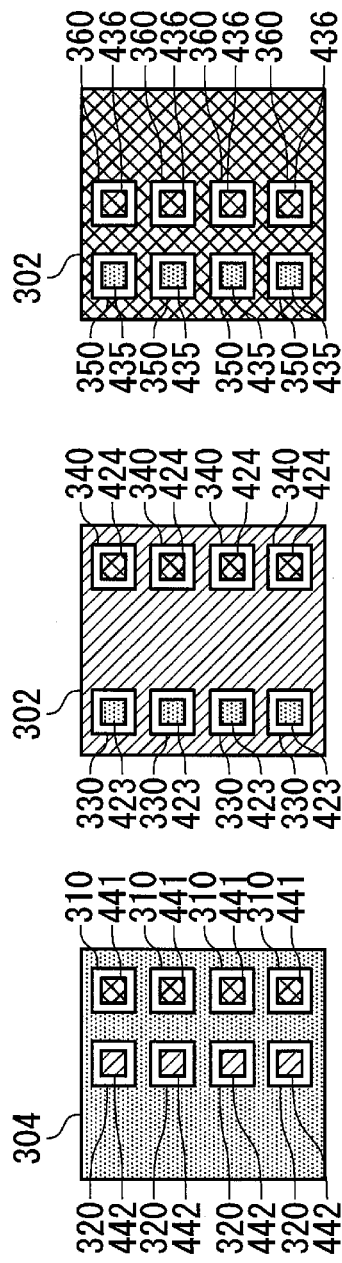
FIGS. 8A to 8C are views showing second to fourth ground metal layers 302 to 304 according to the third exemplary embodiment.

As shown in FIG. 8A, fourth ground patches 441 are provided inside the first holes 310 of the fourth ground metal layer 304. Fourth' ground patches 442 are provided inside the second holes 320 of the fourth ground metal layer 304.

As shown in FIG. 8B, second ground patches 423 are provided inside the third holes 330 of the second ground metal layer 302. Second' ground patches 424 are provided inside the fourth holes 340 of the second ground metal layer 302. Though not shown, fifth ground patches 453 are provided inside the third holes 330 of the fifth ground metal layer 305. Fifth' ground patches 454 are provided inside the fourth holes 340 of the fifth ground metal layer 305.

As shown in FIG. 8C, third ground patches 435 are provided inside the fifth holes 350 of the third ground metal layer 303. Third' ground patches 436 are provided inside the sixth holes 360 of the third ground metal layer 303.

As is obvious from FIG. 7B, the first and fourth ground metal layers 301 and 304, the second and fifth ground patches 423 and 453 and the third' ground patches 436 are disposed so as to overlap one another in a direction perpendicular to one surface of the substrate 130 where the dielectric layers 111 to 116 are laminated.

The fourth' ground patches 442, the second and fifth ground metal layers 302 and 305 and the third ground patches 435 are disposed so as to overlap one another in the direction perpendicular to the one surface of the substrate 130 where the dielectric layers 111 to 116 are laminated.

The fourth ground patches 441, the second' and fifth' ground patches 424 and 454 and the third and sixth ground metal layers 303 and 306 are disposed so as to overlap one another in the direction perpendicular to the one surface of the substrate 130 where the dielectric layers 111 to 116 are laminated.

In this exemplary embodiment, the k-th ground patches $4k1$ represent the third ground patches 431, and the k'-th ground patches $4k2$ represent the third ground patches 432. The (k+m)-th ground patches $4(k+m)3$ represent the second and fifth ground patches 423 and 453, and the (k+m)'-th ground patches $4(k+m)'3$ represent the second' and fifth' ground patches 424 and 454. The (k+s)-th ground patches $4(k+s)5$ represent the third ground patches 435, and the (k+s)'-th ground patches $4(k+s)'6$ represent the third ground patches 436.

As shown in FIG. 7B, the first vias 510 connect the first and fourth ground metal layers 301 and 304, the second and fifth ground patches 423 and 453 and the third' ground patches 436. The second vias 520 connect the fourth' ground patches 442, the second and fifth ground metal layers 302 and 305 and the third ground patches 435. The third vias 530 connect the fourth ground patches 441, the second' and fifth' ground patches 424 and 454 and the third and sixth ground metal layers 303 and 306.

Although the semiconductor device 6 has been described in the case where ground metal layers have three kinds of DC potentials, four or more kinds of DC potentials may be provided likewise in such a manner that holes are provided on ground metal layers and ground patches are disposed in the holes.

In the case of the configuration in FIG. 7, the third holes 330 and the fifth ground patches 453 provided in the fifth ground metal layers 305 may be omitted. In this case, the first vias 510 connecting the fifth ground patches 453 and the fourth ground metal layers 304 may be also omitted. Similarly, the fourth holes 340 and the second' ground patches 424 provided in the second ground metal layers 302 may be omitted. In this case, the third vias 530 connecting the second' ground patches 424 and the third ground metal layers 303 may be also omitted.

FIG. 9 is a view showing characteristic in the case where a 100 pH inductor element is produced by use of the transmission line of the semiconductor device 6. In FIG. 9, characteristic of the semiconductor device 6 shown in FIG. 7 is compared with characteristic (of a so-called ordinary semiconductor device) in the case where all the first to sixth ground metal layers 141 to 146 of the semiconductor device 6 shown in FIG. 7 are set to have a first DC potential. Incidentally, values shown in FIG. 9 are measured values obtained by experimental manufacturing. The inductor element of the semiconductor device 6 has a physical line length (length) of 252.7 μm which is 1% shorter, and an insertion loss (loss) of 0.16 dB which is increased by 0.02 dB, compared with the inductor element of the ordinary semiconductor device. Although it is generally known that insertion loss becomes very large when holes are formed in ground metal layers, it is shown that the semiconductor device 6 in FIG. 7 is practically equivalent to the ordinary semiconductor device in terms of transmission line because there is no significant difference in comparison with the ordinary semiconductor device.

As described above, the same effect as in the second exemplary embodiment can be obtained in the semiconductor device 6 according to this exemplary embodiment. Moreover, in the semiconductor device 6 according to this exemplary embodiment, three or more kinds of DC potentials can be provided to ground metal layers when the k-th ground metal layers $30k$, the (k+m)-th ground patches 430 and the (k+s)' ground patches 460 are disposed on one and the same straight line, the k'-th ground patches 420, the (k+m)-th ground metal layers $30(k+m)$ and the (k+s) ground patches 450 are disposed on one and the same straight line, and the k-th ground patches 410, the (k+m)'-th ground patches 440 and the (k+s)-th ground metal layers $30(k+s)$ are disposed on one and the same straight line.

Fourth Exemplary Embodiment

FIG. 9 shows a semiconductor device 7 according to a fourth exemplary embodiment of the invention. FIG. 9A is a top view of the semiconductor device 7, FIG. 9B is a sectional view of the semiconductor device 7 taken along an alternate long and short dash line B in the top view, and FIG. 9C is a sectional view of the semiconductor device 7 taken along an alternate long and short dash line C in the top view.

The semiconductor device 7 is different from the semiconductor device 3 in FIG. 3 in that the semiconductor device 7 has second to fifth ground metal layers 502 to 505 in place of the second to fifth ground metal layers 142 to 145 in FIG. 3. Although the semiconductor device 7 has second-1 to fifth-1 ground metal layers 502-1 to 505-1 and second-2 to fifth-2 ground metal layers 502-2 to 505-2, these are likewise generically called second to fifth ground metal layers 502 to 505 in this exemplary embodiment.

The second to fifth ground metal layers 502 to 505 are different from the second to fifth ground metal layers 142 to 145 in FIG. 3 in arrangement of the first holes 150, the second holes 160 and the notches 200.

Each k-th ground metal layer 50k (k is 3 or 5 in FIG. 9) has a side L1 and a side L2. The side L1 designates a side nearer to the signal metal layer 130 compared with the side 2. In comparison between a distance d1 to a first hole 150 nearest to the side L1 and a distance d2 to a second hole nearest to the side L2, the distance d1 is longer than the distance d2.

Figure 10A:
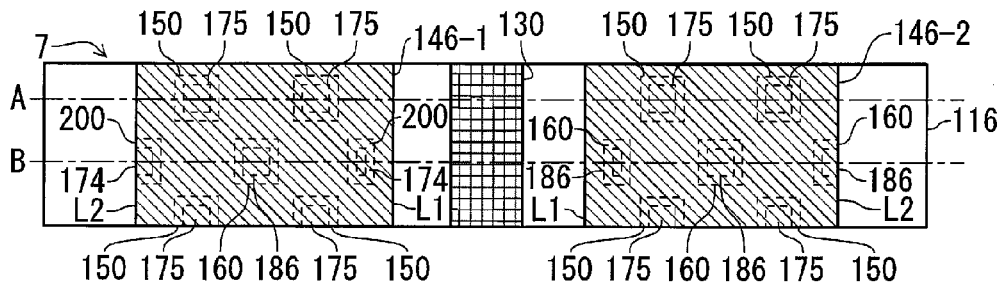
FIGS. 10A to 10C are views showing characteristic of a semiconductor device 7 according to a fourth exemplary embodiment.

An example of the third ground metal layer 503 will be described with reference to FIG. 10A. The fifth ground metal layers 505 have the same configuration as that of the third ground metal layers 503, so that description thereof will be omitted. The third ground metal layers 503 have a plurality of first holes 150 like the third ground metal layers 143 in FIG. 3. Further, the third ground patches 173 are disposed inside the first holes 150. The first holes 150 of the third ground metal layers 503 are disposed near to the side L2 side. That is, in comparison between the distance d1 to a first hole 150 nearest to the side L1 and the distance d2 to a second hole nearest to the side L2, the distance d1 is longer than the distance d2.

Each (k+m)-th ground metal layer 50(k+m) (k+m is 2 or 4 in FIG. 9) has a side L1 and a side L2. The side L1 designates a side nearer to the signal metal layer 130 compared with the side L2. The (k+m)-th ground metal layer 50(k+m) has notches 200 provided in the side L2 but has no notch 200 provided in the side L1.

Figure 10B:
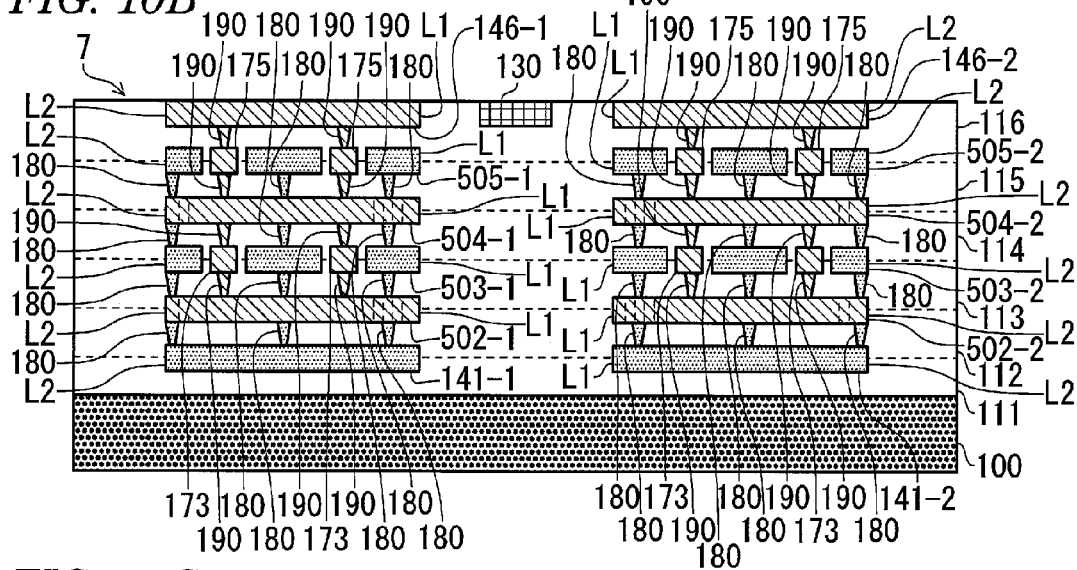
Figure 10C:
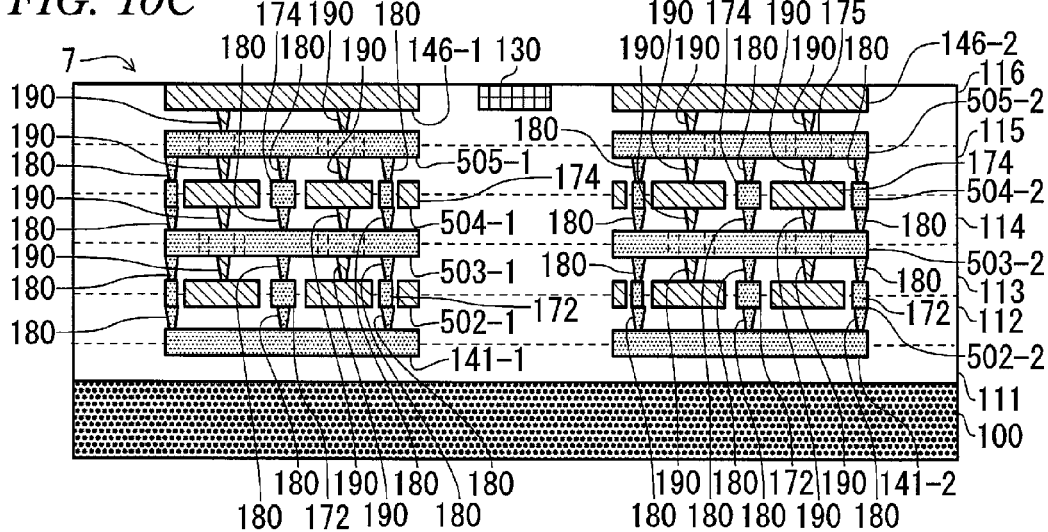
Figure 11A:
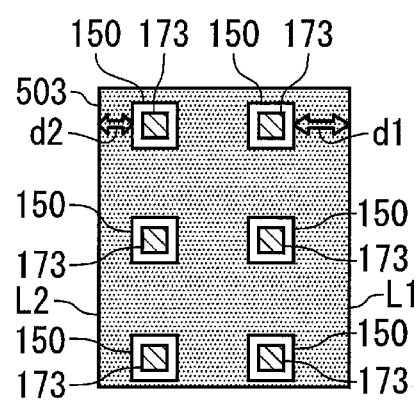
FIGS. 11A and 11B are views showing a second ground metal layer 502 and a third ground metal layer 503 according to the fourth exemplary embodiment.
Figure 11B:
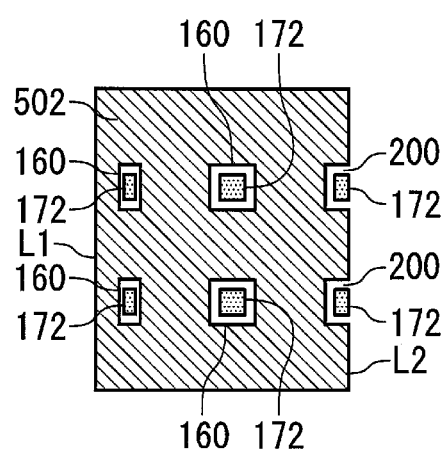

An example of the second ground metal layer 502 will be described with reference to FIG. 10B. The fourth ground metal layers 504 have the same configuration as that of the second ground metal layers 502, so that description thereof will be omitted. The second ground metal layers 502 have notches 200 formed in the side L2 like the third ground metal layers 143 in FIG. 3 but have no notch provided in the side L1.

As described above, in accordance with the fourth exemplary embodiment, the same effect as in the second exemplary embodiment can be obtained and loss of the second and fourth ground metal layers 502 and 504 can be reduced because there is no notch provided in the sides L1 of the second and fourth ground metal layers 502 and 504. Here, the loss of the ground metal layers means that when a signal inputted to the ground metal layers is outputted from the ground metal layers, the outputted signal is smaller than the inputted signal. A current distribution of the ground metal layers is mainly concentrated in sides of the line. Particularly, a larger current is distributed in the side L1 nearer to the signal metal layer 130 than in the side L2. When notches 200 are provided in the side L1 as represented by the second and fourth ground metal layers 142 and 144 in FIG. 3, the loss of the ground metal layers increases. Therefore, in this exemplary embodiment, there is no notch provided in the sides L1 of the second and fourth ground metal layers 502 and 504, so that the loss of the second and fourth ground metal layers 502 and 504 can be reduced.

Incidentally, the invention is not limited to the aforementioned exemplary embodiments per se and constituent members may be modified to embody the invention without departing from the gist of the invention in a practical stage. Constituent members disclosed in the aforementioned exemplary embodiments may be combined suitably to form various inventions. For example, some constituent members may be removed from all constituent members disclosed in each exemplary embodiment. In addition, constituent members in different exemplary embodiments may be combined suitably.

Although the several embodiments of the invention have been described above, they are just examples and should not be construed as restricting the scope of the invention. Each of these novel embodiments may be practiced in other various forms, and part of it may be omitted, replaced by other elements, or changed in various manners without departing from the spirit and scope of the invention. These modifications are also included in the invention as claimed and its equivalents.

What is claimed is:

1. A semiconductor device, comprising:
   a substrate;
   first to n-th dielectric layers which are formed successively on one surface of the substrate, wherein n is a natural number of 2 or more;
   a k-th ground metal layer having a first DC potential and disposed between the k-th dielectric layer and the (k+1)-th dielectric layer, the k-th ground metal layer having at least one first hole therethrough, wherein k is a natural number of $1 \leq k < n$;
   a k-th ground patch disposed in the at least one first hole;
   a (k+m)-th ground metal layer having a second DC potential and disposed between the (k+m)-th dielectric layer and the (k+m+1)-th dielectric layer, the (k+m)-th ground metal layer having at least one second hole therethrough, wherein m is a natural number of $1 \leq m < n-k$;
   a (k+m)-th ground patch disposed in the at least one second hole;
   a first via which connects the k-th ground metal layer and the (k+m)-th ground patch; and
   a second via which connects the (k+m)-th ground metal layer and the k-th ground patch.

2. The device of claim 1, wherein
   the at least one first hole is a plurality of first holes, and
   the at least one second hole is a plurality of second holes, wherein
   the k-th ground patch is disposed in the plurality of first holes so as to be overlapped with the (k+m)-th ground metal layer in a direction perpendicular to the one surface of the substrate, and
   the (k+m)-th ground patch is disposed in the plurality of second holes so as to be overlapped with the k-th ground metal layer in the direction perpendicular to the one surface of the substrate.

3. The device of claim 2, wherein
   the plurality of first holes are formed in a quadrangle shape and formed through the k-th ground metal layer periodically, and
   the plurality of second holes are formed in a quadrangle shape and formed through the (k+m)-th ground metal layer periodically.

4. The device of claim 3, wherein the (k+m)-th ground metal layer has a first side and a second side, and a notch is provided only in the first side of the (k+m)-th ground metal layer,
   wherein the semiconductor device further comprises:
   a (k+m)'-th ground patch disposed in the notch;
   a second' via which connects the k-th ground metal layer and the (k+m)'-th ground patch; and
   a signal metal layer which is disposed in parallel with the (k+m)-th ground metal layer so as to face the second side of the (k+m)-th ground metal layer.

5. The device of claim 4, wherein
a distance d1 between the second side and one of the first holes closest to the second side is smaller than a distance d2 between the first side and one of the first holes closest to the first side.

6. A semiconductor device, comprising:
a substrate;
a dielectric layer formed on the substrate;
a first ground metal layer embedded in the dielectric layer and having a first DC potential, the first ground metal layer having a first hole therethrough;
a first ground patch disposed in the first hole;
a second ground metal layer embedded in the dielectric layer such that the dielectric layer is interposed between the first ground metal layer and the second ground metal layer in a thickness direction of the dielectric layer, the second ground metal layer having a second DC potential and having a second hole therethrough;
a second ground patch disposed in the second hole;
a first via which electrically connects the first ground metal layer and the second ground patch; and
a second via which electrically connects the second ground metal layer and the first ground patch.

* * * * *